United States Patent
Staskus et al.

[19]

[11] Patent Number: 5,835,345
[45] Date of Patent: Nov. 10, 1998

[54] COOLER FOR REMOVING HEAT FROM A HEATED REGION

[75] Inventors: Michael P. Staskus, Saratoga; James M. Haden, San Jose, both of Calif.

[73] Assignee: SDL, Inc., San Jose, Calif.

[21] Appl. No.: 725,118

[22] Filed: Oct. 2, 1996

[51] Int. Cl.$^6$ .................................................. H05K 7/20
[52] U.S. Cl. ...................... 361/699; 165/80.4; 174/15.1; 257/714
[58] Field of Search .................................. 165/80.3, 80.4; 174/15.1; 257/714–716; 361/689, 698, 699, 702, 703

[56] References Cited

U.S. PATENT DOCUMENTS

| | | | |
|---|---|---|---|
| 4,494,171 | 1/1985 | Bland et al. | 361/386 |
| 4,573,067 | 2/1986 | Tuckerman et al. | 357/82 |
| 4,758,926 | 7/1988 | Herrell et al. | 361/385 |
| 4,909,315 | 3/1990 | Nelson et al. | 165/80.3 |
| 5,016,090 | 5/1991 | Galyon et al. | 357/82 |
| 5,103,374 | 4/1992 | Azar | 361/689 |
| 5,105,430 | 4/1992 | Mundinger et al. | 372/35 |
| 5,388,635 | 2/1995 | Gruber et al. | 165/80.4 |
| 5,526,231 | 6/1996 | Arz et al. | 361/689 |

*Primary Examiner*—Gregory D. Thompson
*Attorney, Agent, or Firm*—W. Douglas Carothers, Jr.

[57] ABSTRACT

A cooler features a plurality of microchannels each of which includes a plurality of baffles disposed therein to avoid laminar flow within each microchannel through modulation which varies both the direction and velocity of fluid flowing through each microchannel. The microchannels are formed between a plurality of spaced apart thermally conductive fins, which are arranged to extend from a thermally conductive substrate adapted to be in physical contact with a region to be cooled. The fins are formed by stacking a plurality of thin sheets along a direction transverse to a longitudinal axis of the microchannels. Each sheet includes a plurality of apertures spaced apart along two transverse directions, both of which are transverse to the stacking direction. The baffles are formed from the spaces disposed between the apertures. Preferably, each sheet is formed from copper which is chemically etched to form the apertures in the sheet.

22 Claims, 9 Drawing Sheets

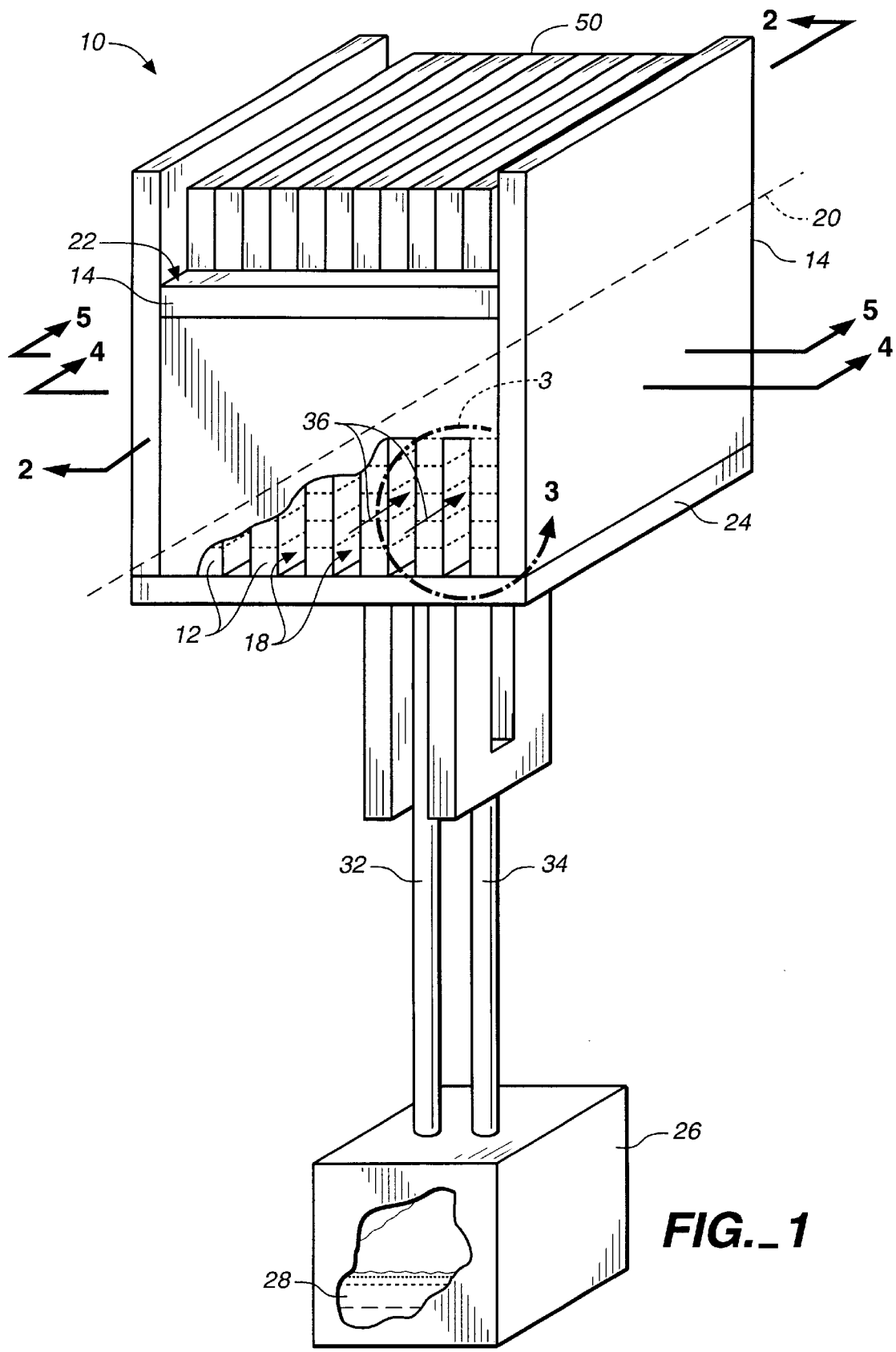
FIG._1

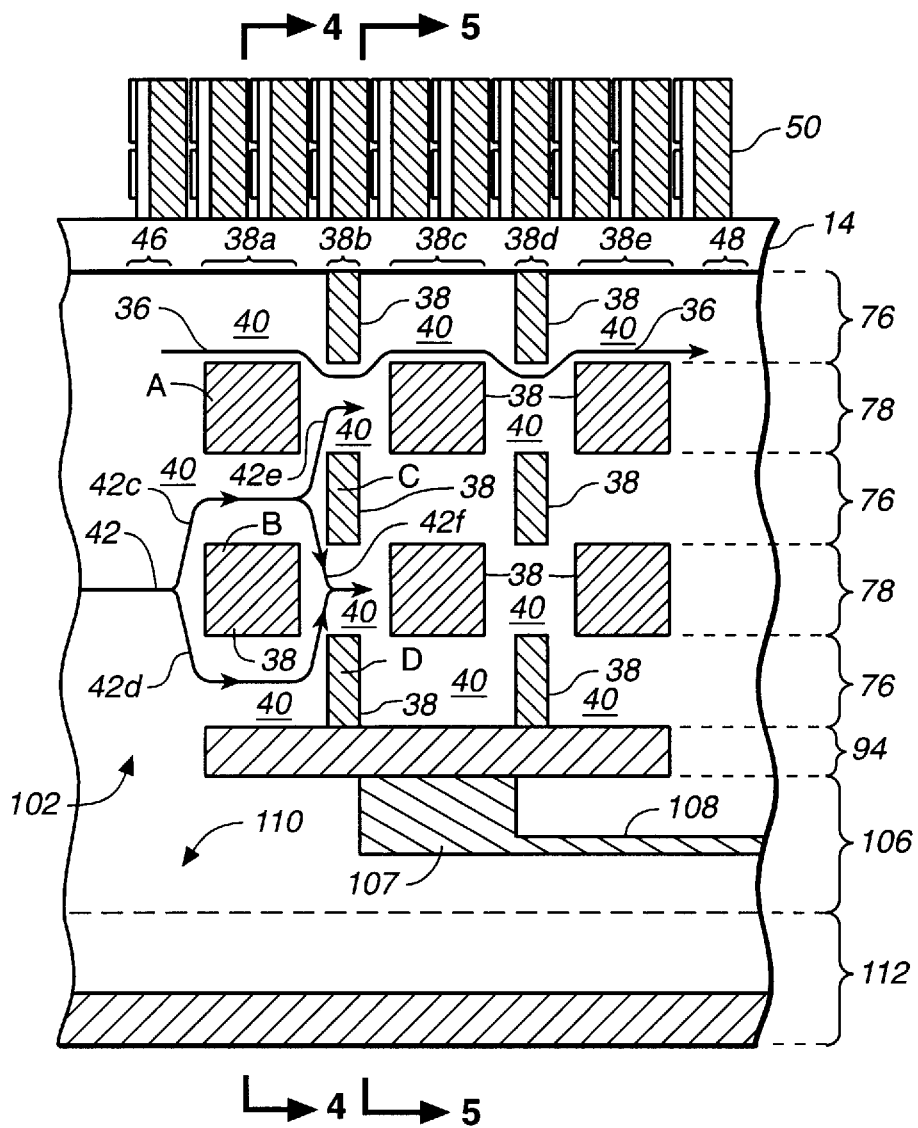
FIG._2

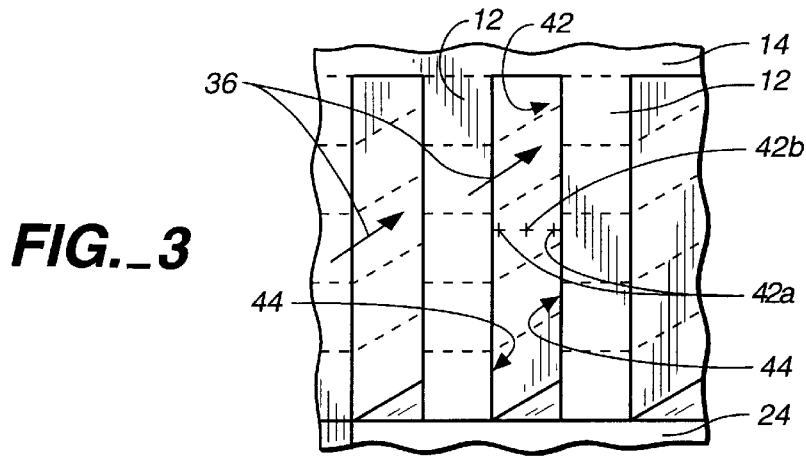
FIG._3
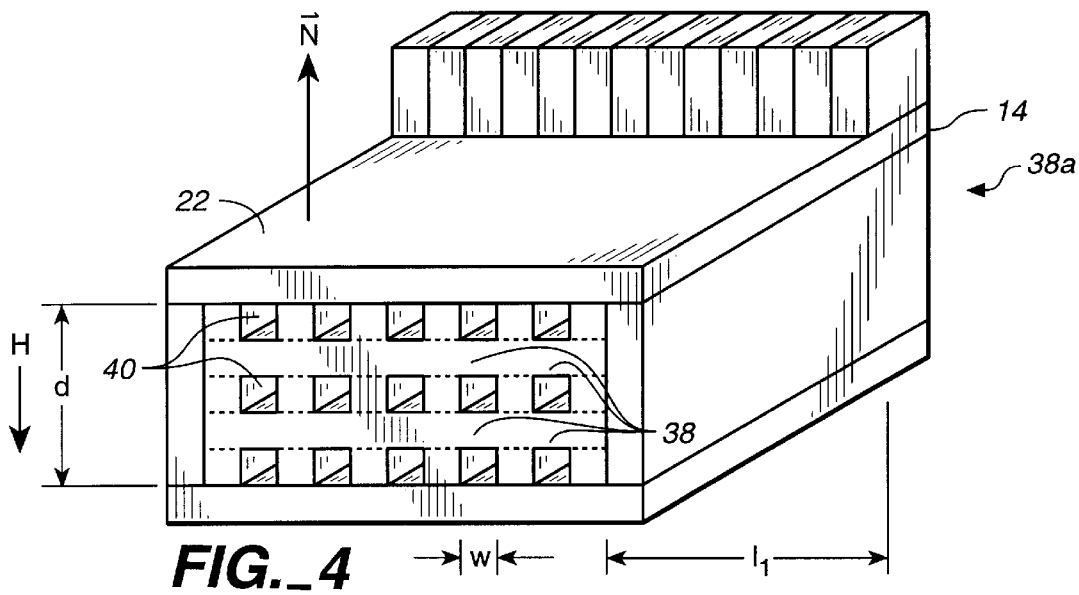
FIG._4
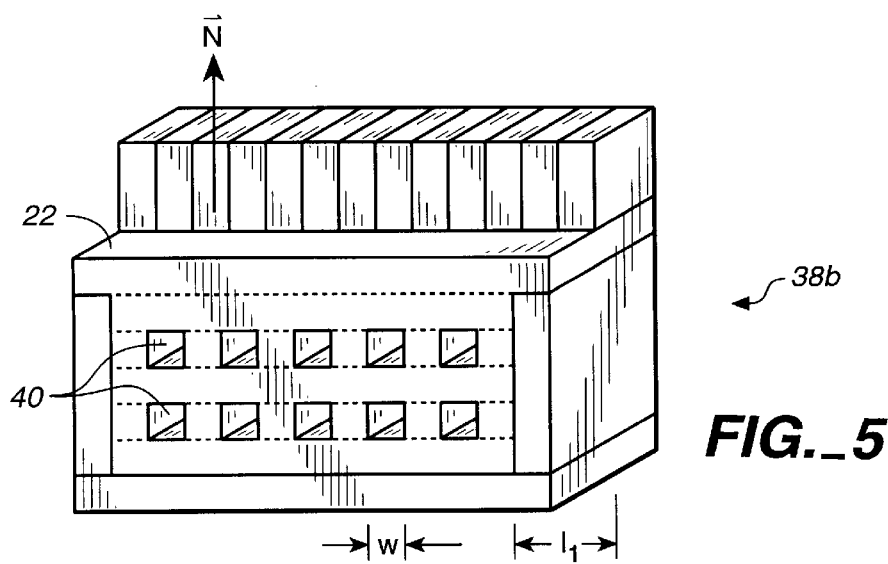
FIG._5

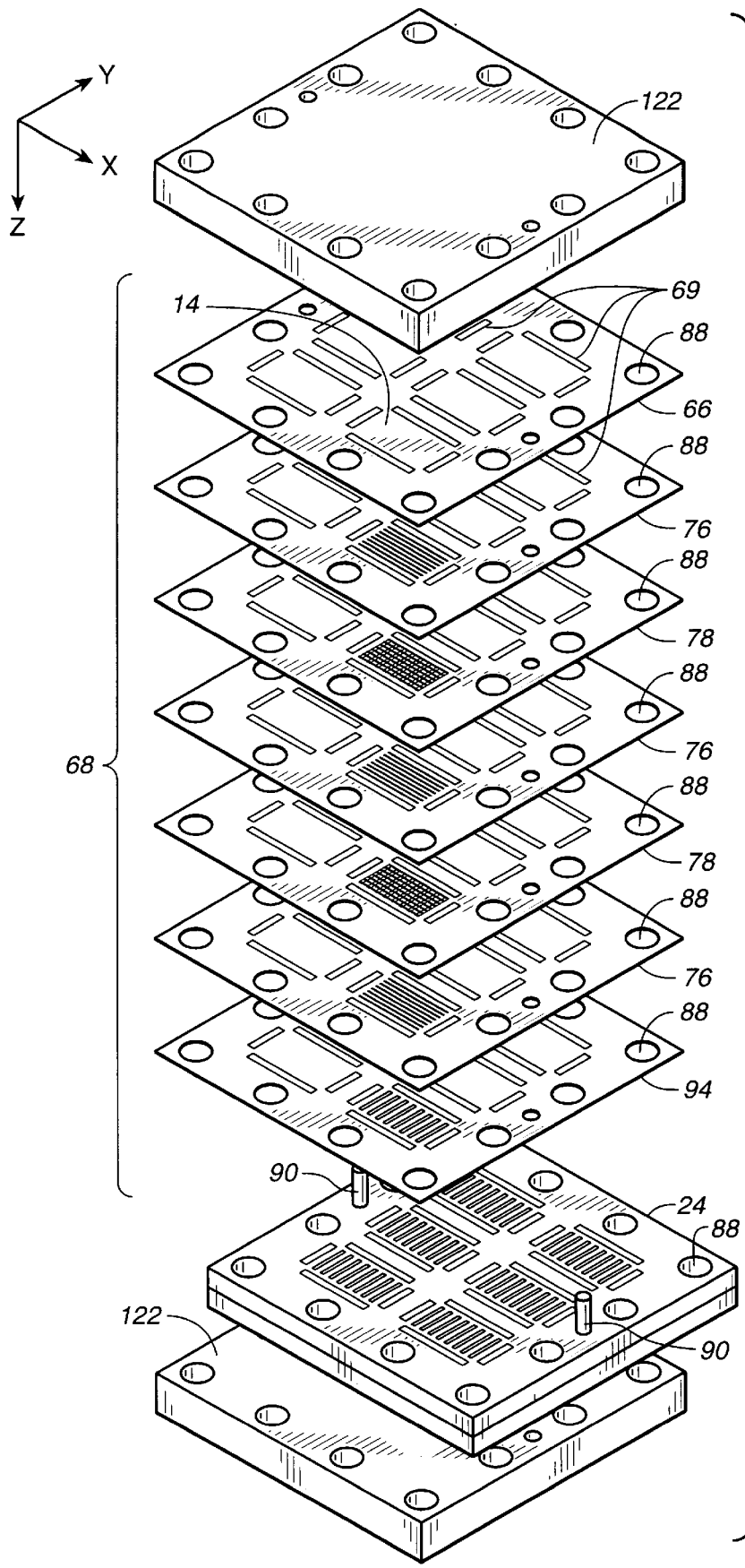
FIG._6

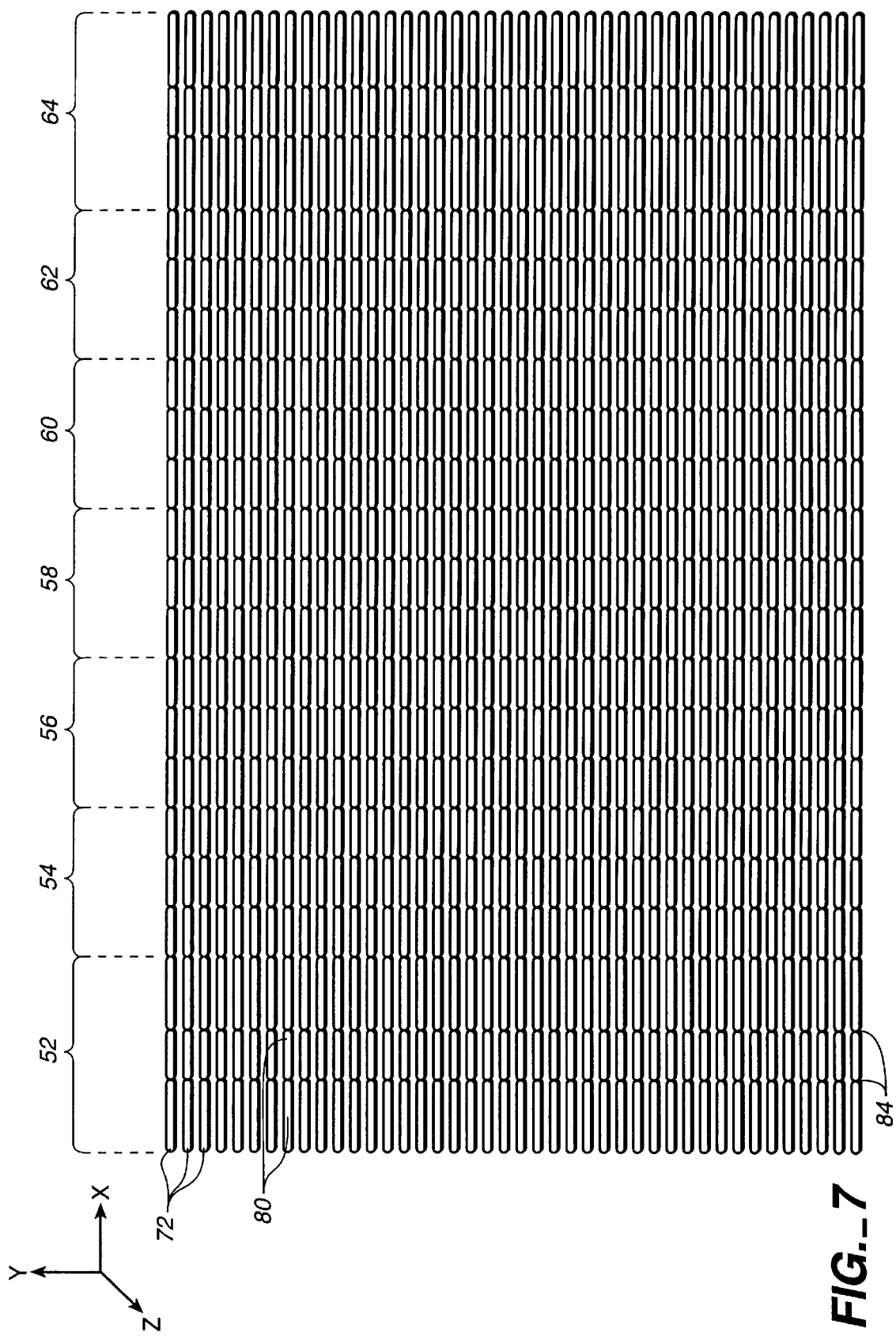
FIG._7

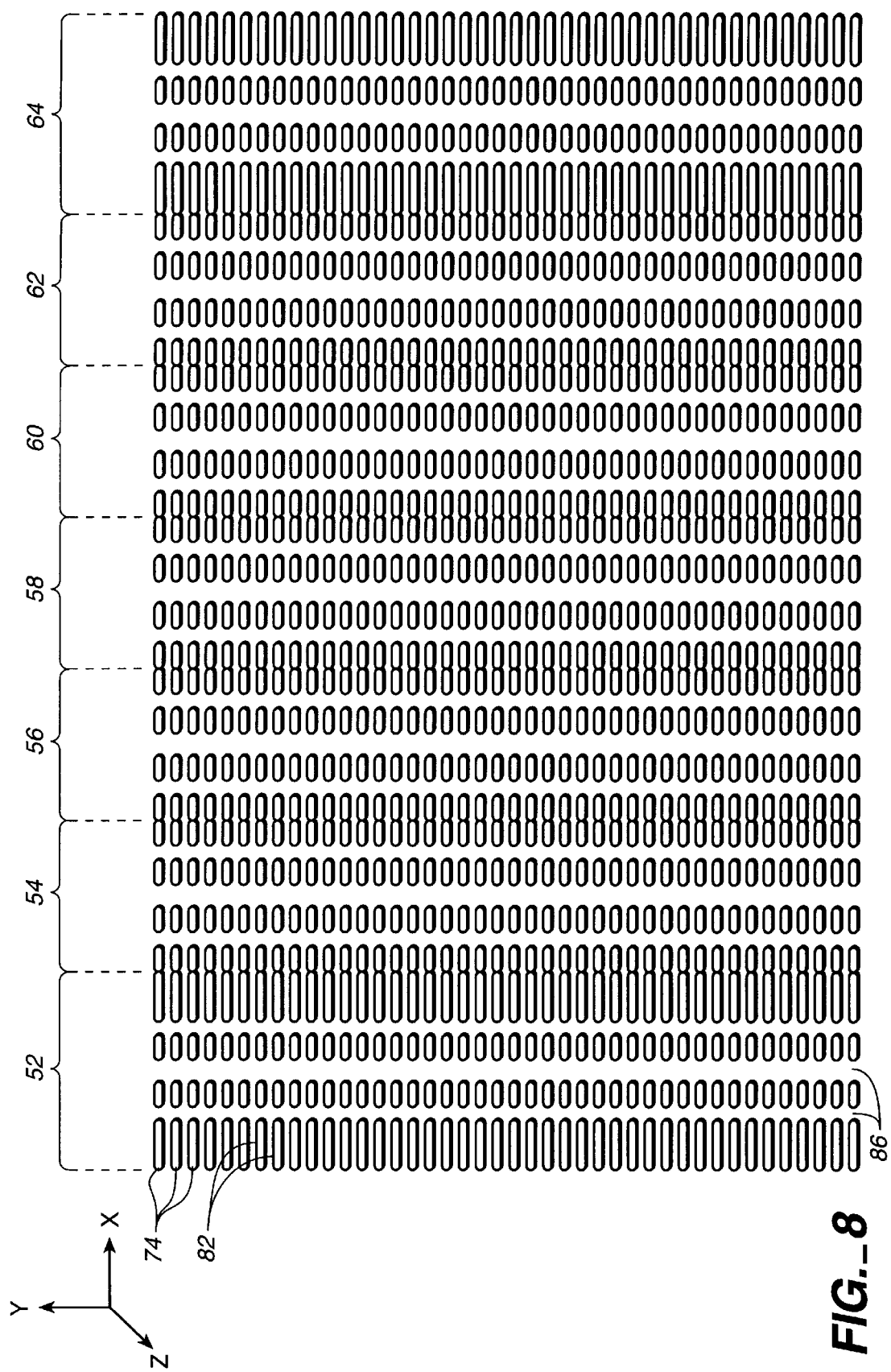
FIG._8

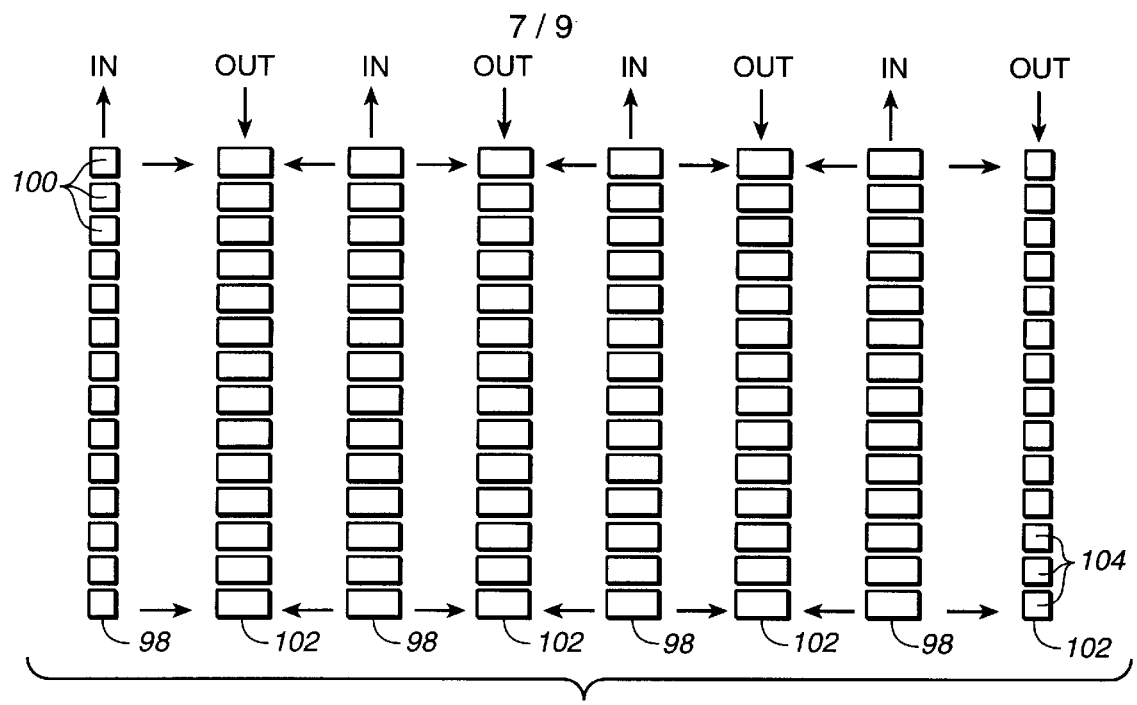
FIG._9
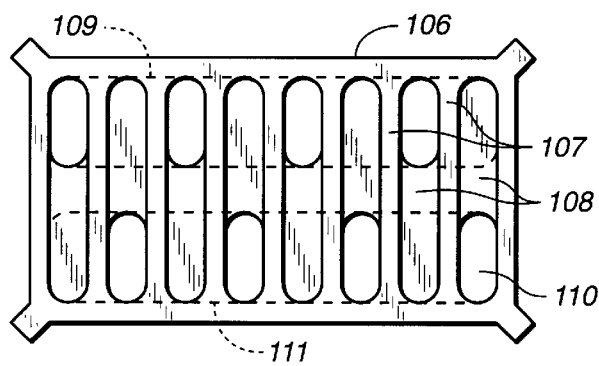
FIG._10
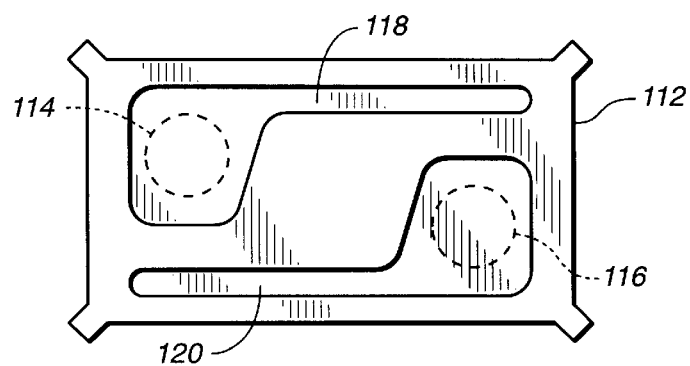
FIG._11

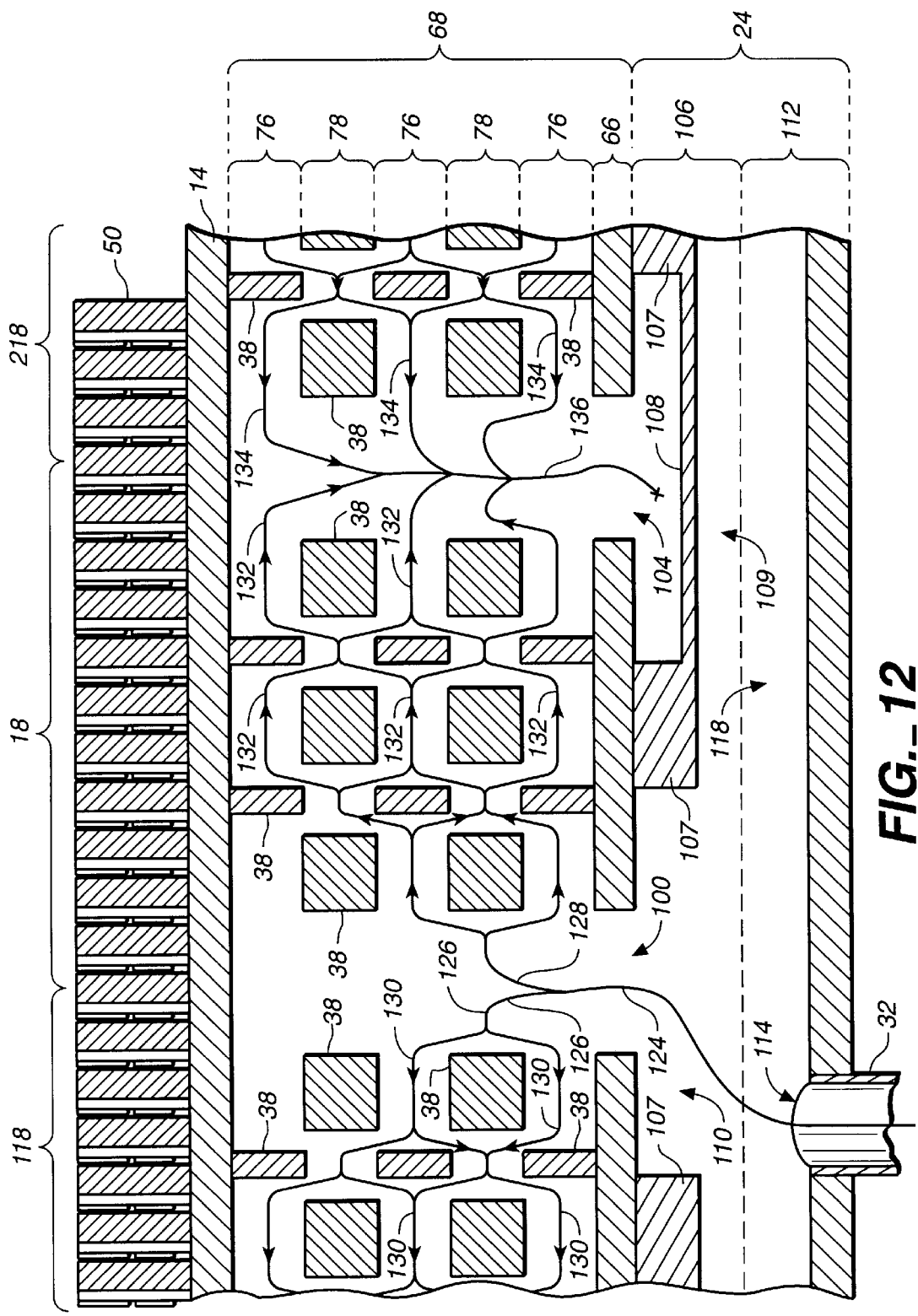
FIG._12

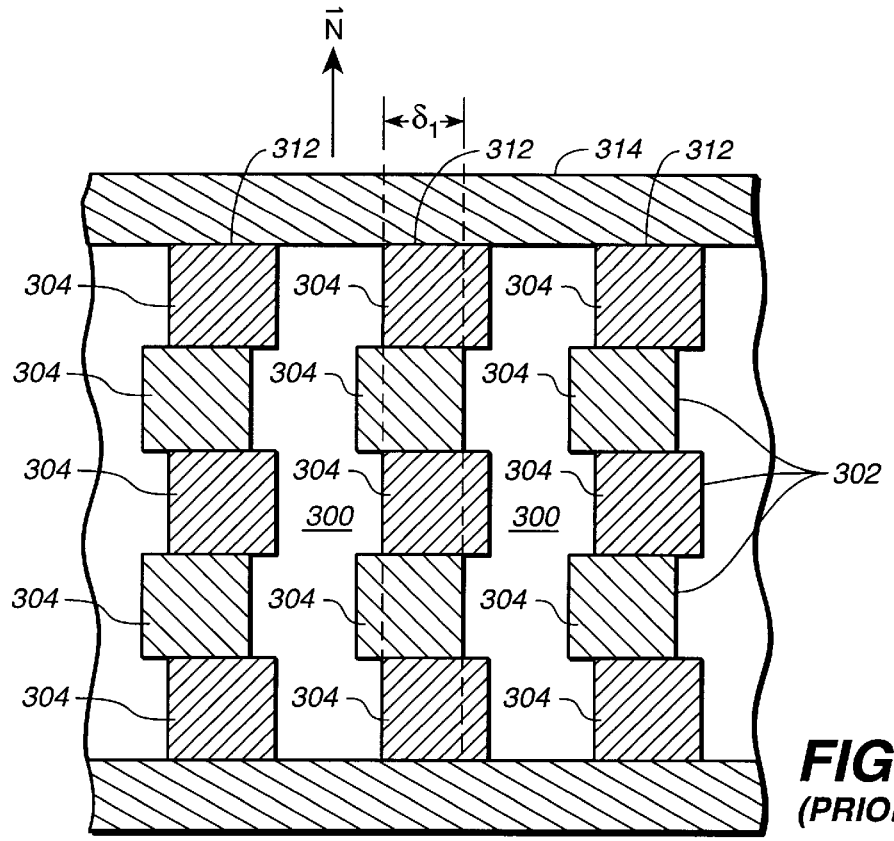
FIG._13
*(PRIOR ART)*
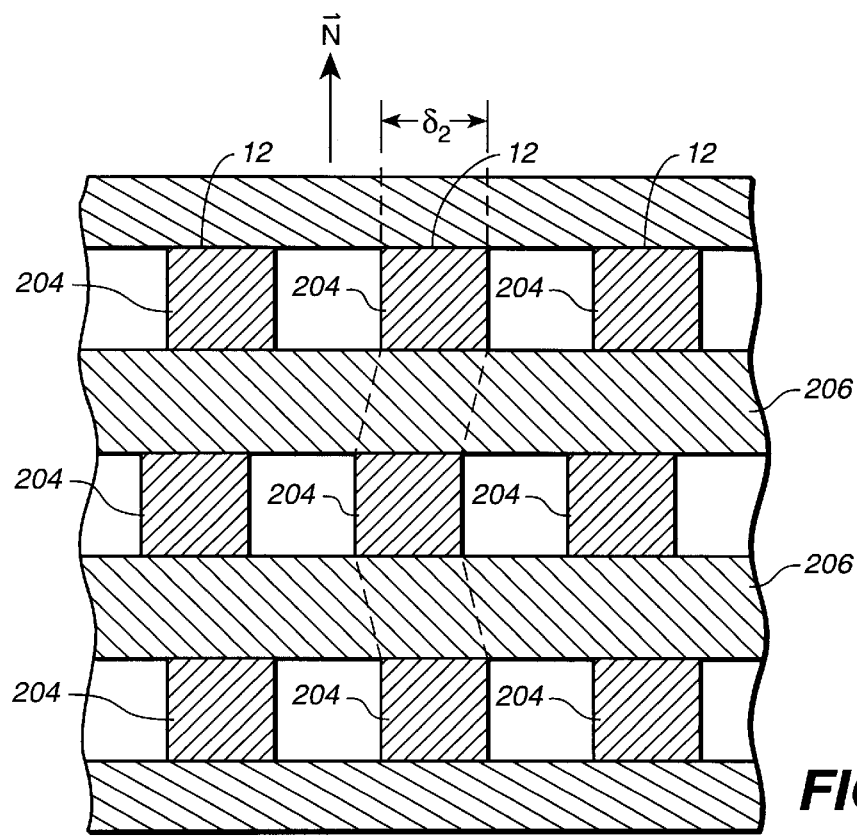
FIG._14

COOLER FOR REMOVING HEAT FROM A HEATED REGION

TECHNICAL FIELD

The present invention pertains to heat transfer devices. More particularly, the present invention relates to microchannel coolers for laser diode arrays.

BACKGROUND ART

Excess heat is generated in many electrical and mechanical applications of microminiature devices and is often a limiting physical force which contributes to premature degradation and wear of the devices. Microprocessors, for example, may generate excess heat through internal electrical resistances which requires thermal relief to avoid breakdown via shorting of p-n junctions. Mechanical devices, such as those employing micro-machined gears and components, also generate unwanted heat through friction which leads to cracking and complete failure of contacting surfaces.

Applications for arrays of integrated laser diode bars, in particular, are often limited by the ability to remove the waste heat generated during operation. As the bars are more closely packed together, the heat generated by lasers must be more efficiently removed to avoid unwanted reductions in the lifetime and efficiency of the bars. Further, heat removal must be accomplished to avoid thermal differences between the lasers associated with the laser bar. This ensures wavelength stability across the laser bar, which becomes increasingly difficult as the power level of the laser diode bar increases. Attempts to alleviate these problems focus on achieving uniform thermal impedance across the laser diode bar.

In an attempt to alleviate the problem of excess heat generation, such heat generating devices, e.g., the laser diode bars, are often bonded with a substrate formed of a thermally conductive material such as copper or silicon. A series of microchannels is formed between thermally conductive fins which are in thermal contact with the substrate. Microchannels are typically defined as channels having a size sufficient to induce capillary action. Water, or some other liquid coolant, is caused to flow through these microchannels. Heat flows into the coolant from the substrate and from the fins dividing the channels and is carried away.

The thermal impedance of the aforementioned cooling devices is typically the sum of the thermal impedance of the substrate and the fins, as well as the coolant boundary layer. For purposes of this application, the coolant boundary layer is defined as the interface of the coolant flowing through the microchannels at the surface of either the fins or the substrate. Low thermal impedance of the substrate and fins is achieved by using a thermally conductive material such as copper for the substrate, and forming the channels into the substrate very closely to the heat source. Typically, the thermal impedance of the coolant is much greater than the thermal impedance of either the fins or substrate.

The thermal impedance of the coolant boundary layer can be reduced by increasing the length of the microchannel, which effectively increases the area of the coolant boundary layer. Due to the inherent thermal conductivity of the fins, there is a point at which making the fins any larger no longer affects thermal impedance. This is expressed in terms of an aspect ratio; that is, the ratio of the length of the fins to their width. For copper, the aspect ratio is about ten to one. The thermal impedance of the coolant boundary layer can also be reduced by reducing the spacing between the fins, effectively narrowing the width of the channels. Narrowing the width of the channels reduces the area of the coolant through which heat must propagate. As with the fins, there is a point at which varying the width of the channels will no longer reduce thermal impedance. A minimum volume of fluid must pass through each channel to efficiently remove heat from the fins.

Optimizing the dimensions of the fins, for a given channel width, involves a tradeoff, as thinner fins allow more of the heat in the fins to escape into the coolant boundary layer, but thicker fins allow more heat to escape through the length of the fins. Many prior art attempts have been made employing the aforementioned concepts.

For example, U.S. Pat. No. 4,494,171 to Bland et al. discloses an impingement cooling apparatus for use in removal of heat. The apparatus includes, inter alia, a housing on which the device to be cooled is secured and a stack of plates fitted within the housing. The stack of plates defines a plurality of fins and channels. Coolant is provided through fin orifices. High thermal conductance is provided by arranging the fin orifices so that coolant passing therethrough impinges upon an adjacent fin disposed in the direction of coolant flow.

U.S. Pat. No. 4,758,926 to Herrell et al. discloses a fluid-cooled integrated circuit package which include, inter alia, a planar substrate having a plurality of integrated circuit chips disposed thereon. A heat sink assembly is in heat exchange communication with each of the chips. The assembly is parallel to a substrate and includes an inlet and an outlet for receiving and discharging coolant fluid, respectively. A plurality of microchannels are formed in the assembly, proximate to the chips. Each of the microchannels are in fluid communication with both the inlet and the outlet via input and output apertures, respectively.

U.S. Pat. No. 4,909,315 to Nelson et al. discloses a fluid heat exchanger for an electronic component including, inter alia, a housing, a base and a plurality of fins. One side of each of the fins is integral with the base and positioned so that the fins are perpendicular thereto. Concentric inlet/outlet tubes are disposed in the center of base. A recess is disposed in a side of each of the plurality of fins, proximate to the concentric inlet/outlet tube. The recess allows fluid exiting the inlet tube to pass through to each of the plurality of fins so as to provide a non-uniform fluid flow therethrough. In this fashion, the heat exchanger provides a temperature gradient across the heated object to be cooled.

U.S. Pat. No. 5,105,430 to Mundinger et al. discloses a thin planar package for cooling an array of edge-emitting laser diodes including, inter alia, a microchannel heat sink in thermal communication with the laser diodes. To provide coolant to the microchannels, a thin planar assembly is provided which comprises of passageways that connect the microchannels to inlet and outlet corridors. Each inlet passageway typically comprises of a narrow slot that directs coolant into the microchannels and increases the velocity of flow therethrough. In this fashion, heat generated by the laser diodes is efficiently dissipated.

U.S. Pat. No. 5,016,090 to Gaylon et al. discloses a cross-hatch flow distribution device which includes, inter alia, two set of channels which run perpendicular to each other. The first set of channels is formed on a base plate, and the second set of channels is formed on a separate plate, the distribution plate. The second set of channels includes a set of inlet channels and a set of interleaved outlet channels. An interposer plate includes a plurality of nozzles which cause a liquid coolant to impinge, under pressure, on the base plate.

A drawback with the aforementioned devices results from a laminar flow that develops in the coolant boundary layer disposed proximate to the walls of the microchannels. Specifically, it is known that the coolant boundary layer moves at a slower rate than the coolant which is centered in the microchannel. This results in a higher thermal impedance in the coolant as the laminar flow causes the coolant boundary layer to act as a thermal storage layer. This impedes thermal transfer from the fins to the more rapidly moving coolant centered in the microchannel, effectively reducing thermal transfer of the fins. Prior art coolers have recognized this problem.

In U.S. Pat. No. 4,573,067 to Tuckermann et al., a device for heat removal from semiconductor circuits is disclosed as including, inter alia, a heat conductive planar member having a recessed portion. A plurality of posts extend from the recess so as to be in intimate thermal contact with the integrated circuit chip to be cooled. The posts are arranged in a plurality of linear columns and rows forming a matrix. In this manner, turbulent flow is achieved in the recess, thereby avoiding laminar flow.

A drawback with Tuckermann et al. results from the substantially reduced fin area necessitated to achieve turbulent flow in a microchannel, which results in substantially increased thermal impedance of the device. What is needed is a cooler that avoids laminar flow in the microchannels without reducing fin area.

SUMMARY OF THE INVENTION

The above objective has been met with a cooler for laser diode arrays featuring a plurality of microchannels, each of which includes a plurality of baffles disposed therein to avoid laminar flow within each microchannel through modulation of a coolant flowing therethrough. The microchannels are formed between a plurality of spaced apart thermally conductive fins, which are arranged to extend from a thermally conductive substrate, adapted to be in physical contact with a region to be cooled. The fins are formed by stacking a plurality of thin sheets along a direction transverse to a longitudinal axis of the microchannels. Each sheet includes a plurality of apertures, spaced apart along two transverse directions, forming a grid-like array. The baffles are formed from the regions disposed between the apertures. Preferably, each sheet is formed from copper which is chemically etched to form the apertures in each sheet. Also etched into each sheet are registration holes to facilitate alignment of the sheets when stacked. The etched sheets are then coated with a thin film of silver. The sheets are then stacked together using the registration holes and alignment pins as a guide, super-imposing the rows of apertures in adjacent sheets to form narrow microchannels. The thermally conductive substrate is typically manufactured from a sheet of copper that has been pierced with only registration holes.

A stainless steel clamp, having holes to receive the alignment pins, maintains the alignment of the sheets while the same is heated. In this fashion, the combination of copper and silver brazed together form the aforementioned fins and microchannels. The clamp is then removed after the stack has cooled and the braze hardened. A manifold is attached to one end of the microchannels. The manifold may be attached so as to be brazed together with the aforementioned sheets, or may be attached subsequent to the brazing step. The manifold is constructed to allow coolant to flow in each of the microchannels while reducing the pressure required to facilitate coolant flow therethrough.

An operative example of the present invention is provided wherein each microchannel cooler includes forty-five rows of parallel microchannels, with seven collinear and spaced-apart microchannels within each row. Five sets of baffles are located within each microchannel. Each baffle set is spaced apart from an adjacent set along a direction parallel to a longitudinal axis of the microchannel. Each baffle within a set is spaced apart from an adjacent baffle along a direction transverse to the longitudinal axis of the microchannel, forming a volume therebetween. The baffles of each set are aligned with the volumes of an adjacent set of baffles. The length of the baffles, measured parallel to the coolant flow, are varied to achieve minimal pressure drop between the input and output flow while obtaining maximum modulation and thermal conductivity. To that end, baffles having the greatest length are located at the center, as well as the opposite ends of the microchannels. Disposed between the center baffles and those located at the opposite ends are baffles having a shorter length.

BRIEF DESCRIPTION OF THE DRAWINGS

FIG. 1 is a perspective view of a microchannel cooler in accord with the present invention.

FIG. 2 is an enlarged side sectional view of a portion of the cooler shown in FIG. 1 taken along lines 2—2.

FIG. 3 is a detailed view of the cooler shown in FIG. 1.

FIG. 4 is a front sectional view of the cooler shown in FIGS. 1 and 2 taken along lines 4—4.

FIG. 5 is a front sectional view of the cooler shown in FIGS. 1 and 2 taken along lines 5—5.

FIG. 6 is an exploded perspective view showing a method of forming the cooler shown in FIG. 1.

FIG. 7 is a detailed view of a first pattern of apertures shown in FIG. 6.

FIG. 8 is a detailed view of a second pattern of apertures shown in FIG. 6.

FIG. 9 is a detailed view of a third pattern of apertures shown in FIG. 6.

FIG. 10 is a top down view of a interleaved plate included in a fluid distribution manifold shown in FIG. 1.

FIG. 11 is a top down view of a conduit coupling plate fluid included in a distribution manifold shown in FIG. 1.

FIG. 12 is an enlarged side sectional view of a portion of the cooler shown in FIG. 1 showing three microchannels associated with a common row of microchannels.

FIG. 13 is a detailed cross-sectional view of a prior art cooler.

FIG. 14 is a detailed cross-sectional view of the cooler shown in FIG. 4.

BEST MODE FOR CARRYING OUT THE INVENTION

Referring to FIG. 1, a modular microchannel cooler 10 features a plurality of spaced apart thermally conductive fins 12. Fins 12 extend from a thermally conductive substrate 14. The spaces between fins 12 form a plurality of parallel microchannels 18 extending along a longitudinal axis 20 of cooler 10. Although there may be any number in an exemplative embodiment, cooler 10 includes forty-five rows of parallel and spaced-apart microchannels, with seven collinear, spaced-apart, microchannels being present within each row. For simplicity, however, only one microchannel 18 from five different rows is shown in the figure. A surface 22 of substrate 14 preferably has a profile to facilitate physical contact with a heated region, such as a laser array 50. To that end, surface 22 of substrate 14 typically has a profile complementary to the contour of laser array 50, which is shown as being planar in this example. A fluid distribution manifold 24 is attached to fins 12 at one end of cooler 10, opposite to substrate 14, and is positioned between a supply 26 of coolant 28 and cooler 10. Coolant 28 is supplied to manifold 24 via an input conduit 32. In this fashion, fluid distribution manifold 24 divides coolant 28 so as to enter each of the microchannels 18, discussed more fully below. An output conduit 34 extends between manifold 24 and supply 26, as well.

Referring to FIGS. 1 and 2, each microchannel 18 has a flow path 36 that extends parallel to longitudinal axis 20. Disposed in flow path 36 are a plurality of baffles 38. Five sets of baffles 38a, 38b, 38c, 38d and 38e are arranged within each microchannel 18; however, any number of baffle sets may be employed, dependent upon the application. Each baffle 38 within a set is spaced apart from an adjacent baffle 38, within the same set, along a direction transverse to flow path 36, defining a volume 40 therebetween. Additional volumes 40 are associated with sets 38a, 38c and 38e. Specifically, baffles 38 associated with sets 38a, 38c and 38e are spaced apart from substrate 14 and manifold 24, defining volumes 40 therebetween. Each set 38a, 38b, 38c, 38d and 38e is spaced apart from an adjacent set along a direction parallel to flow path 36 so that volumes 40 of one set are aligned with baffles 38 of an adjacent set.

Referring to FIGS. 2 and 3, baffles 38 overcome a problem associated with laminar flow. As coolant passes into microchannel 18, a streamline flow 42 develops therein. A portion of the flow 42a, closest to the walls 44 of fins 12, as best seen in FIG. 3, moves more slowly than a portion of flow 42b centered within microchannel 18. This has deleterious effects on the thermal conductivity of the fins 12. Specifically, flow portion 42a frustrates the ability of flow 42 to carry away heat transmitted from substrate 14 by fins 12 because of its relatively slow velocity, when compared to the velocity of flow portion 42b. Further, flow portion 42a acts as a thermal storage layer impeding thermal transfer from the fins 12 to the more rapidly moving flow portion 42b, due to the inherently higher thermal impedance of the coolant 42, with respect to the thermal impedance of fins 12. This effectively reduces the thermal transfer characteristics of cooler 10. To avoid the aforementioned laminar flow problem, baffles 38 are disposed within each microchannel to modulate flow 42 by varying either flow 42's velocity, direction or both.

For example, as seen in FIG. 2, after traveling through microchannel 18 a predetermined distance, streamline flow 42 may impinge upon baffle B. Baffle B causes streamline flow 42 to divide into a plurality of tributaries, two of which are shown as 42c and 42d and directed through a different volume of set 38a. As tributaries 42c and 42d continue to travel along flow path 36, each impinges upon a different baffle, shown in FIG. 2 as baffles C and D, respectively, of set 38b. As with baffle B, the baffles of set 38b may form additional tributaries 42e and 42f, shown with respect to baffle C. Additionally, the baffle of the second set may simply redirect the tributary to merge with another tributary, shown with respect to tributary 42d and baffle D.

Referring also to FIGS. 4 and 5, a turbid flow is present proximate to each baffle 38 which produces the aforementioned tributaries, forming a plurality of serpentine flows in microchannel 18. It is believed that the turbidity associated with the serpentine flow is sufficient to disrupt laminar flow portion 42a, thereby increasing the thermal conductivity of the coolant travelling through microchannel 18. To obtain turbid flow, each baffle 38 extends completely across a width "w" of microchannel 18, measured transverse to both flow path 36 and a normal $\vec{N}$ to surface 22 of substrate 14. Thus, each baffle varies a direction of coolant flow 42 along a direction parallel to the normal $\vec{N}$.

A drawback with varying the direction and velocity of flow 42 is that back-pressure develops in the microchannel 18, resulting from a decrease in cross-sectional area through which coolant 28 may flow. This is readily apparent by comparing FIGS. 4 and 5, wherein baffle set 38a is shown forming fifteen volumes 40 and baffle set 38b is shown forming ten volumes 40, respectively. The reduction in cross-sectional area results in a greater amount of back-pressure being developed by baffle set 38b, when compared to the back-pressure developed by baffle set 38a. The back-pressure necessitates an increase in the pumping force used to move coolant flow 42 through cooler 10, leading to an increase in the pressure developed in the cooler 10. This may compromise the fluid-tight integrity of the cooler 10 and result in premature failure. To control the pressure build-up in cooler 10, the length of baffle sets 38b and 38d is minimized, discussed more fully below. Nonetheless, the drop in thermal transfer due to back-pressure is slightly offset by increased lateral thermal conductivity that each baffle 38 provides.

Typically, baffles 38 are formed from the same material as fins 12, discussed more fully below. As mentioned above, the thermal conductivity of fins 12 is much greater than the thermal conductivity of coolant 28. Baffles 38, therefore, have a much greater thermal conductivity than coolant 28 which moves through each of the microchannels 18. In this fashion, each baffle 38 amplifies lateral thermal conductivity, defined as thermal conductivity measured parallel to the width "w" of microchannel 18, as shown in FIGS. 4 and 5. This provides two important benefits. First, the depth "d" of microchannel through which heat must propagate from substrate 14 is reduced, thereby reducing the thermal effect of coolant 28 on heat propagation. Second, greater control over the thermal equilibrium is achieved by allowing heat to spread more quickly to adjacent fins 12.

For example, referring to FIGS. 3, 4 and 5, heat propagating along direction $\vec{H}$, from substrate 14 through coolant 28 in microchannel 18, dissipates much slower than heat propagating through fin 12. By placing baffles 38 spaced apart along the depth "d" of each microchannel, the effective distance that heat must propagate through coolant 28 is reduced. Rather, the heat quickly comes in contact with a baffle 38 which has a much higher thermal conductivity than coolant. This reduces an effective thermal impedance between a subportion of fin 12 in contact with baffle 38 and substrate 14, as compared to the thermal impedance between the same two points in the absence of baffle 38. In this fashion, the thermal impedance between any subportion of fin wall 44 and substrate 14 may be varied, or adjusted, independent of either microchannel width "w" or the thermal impedance of coolant 28.

Moreover, as each baffle 38 spans between two adjacent fins 12, heat present in baffle 38 may be quickly dissipated laterally therebetween. In this manner, the temperature of surface 22 may be kept substantially uniform. However, increasing the area of baffles 38 within each microchannel 18 also increases the back pressure therein. Thus, there is a tradeoff in which thermal conductivity and modulation are to be maximized while reducing back-pressure which necessitates varying the length of baffles 38. This typically requires that the length "$l_1$" of each baffle 38 in sets 38a, 38c and 38e be greater than the length "$l_2$" of each baffle 38 in sets 38b and 38d. It should be understood, however, that baffles 38 may have any dimension required, dependent upon the application.

Referring again to FIGS. 2, 4 and 5, an example of an operative embodiment is described with respect to an array of semiconductor laser diodes 50 that is approximately 2 cm along the X-axis and 1 cm along the Y-axis. The array 50 is positioned to be in thermal communication with substrate 14. Substrate 14 has an area at least as large as the area of the array 50. Maintaining a uniform temperature across the array 50 is critical, because the wavelength emitted by a laser diode typically drifts with temperature. To reduce pressure and temperature variance within each microchannel 18, cooler 10 is configured with independent groups of microchannels. Although any number of microchannels 18 may be employed, in this example seven independent groups of microchannels, spaced apart along the X-axis, are in thermal communication with substrate 14. Each group of microchannels includes forty-five rows of parallel microchannels that are spaced apart along the Y-axis.

Although the dimensions of baffles may be any desired, in this example the length "$l_1$" of each baffle 38 in sets 38a, 38c and 38e is approximately 0.0430 cm, with the lengths "$l_2$" of those in sets 38b and 38d being approximately 0.0100 cm, shown more clearly in FIGS. 4 and 5. As mentioned above, the width "w" of each baffle 38 extends across the entire width of microchannel 18, which typically measures 0.0127 cm. Baffles 38 within each set are spaced apart from an adjacent baffle approximately 0.0127 cm, therefore providing volumes 40 with a height and width of approximately 0.0127 cm. Front 46 and rear 48 portions of microchannel 18 typically measure 0.0127 cm in length and do not include any baffles 38. Baffle set 38b is spaced apart from baffle sets 38a and 38c approximately 0.0100 cm, forming voids through which coolant may flow to travel between volumes 40 of differing baffle sets. Similarly, baffle set 38d is spaced apart from baffle sets 38c and 38e 0.0100 cm.

Referring to FIGS. 2 and 6–9, to form the aforementioned groups of microchannels, photo-lithographic techniques are employed to create a plurality of apertures in a plurality of copper sheets 68. Any size copper sheet 84 may be employed; however, this particular example is described with rectangularly shaped copper sheets 68 that measure approximately 30.5 cm² and 0.0127 cm thick. These dimensions can be varied substantially and are application dependent.

A pattern is disposed on sheets 68, using conventional techniques, to form six coolers 10 at a time. For each cooler 10, microchannels 18, of each of the aforementioned seven groups are formed by the super-imposition of sheets 68 etched to have differing patterns. The pattern of apertures for each cooler 10 or sheets 76 and 78 includes seven groups of apertures 52, 54, 56, 58, 60, 62 and 64 which are spaced apart along the X-axis and Y-axis, forming a grid-like array. Each group of apertures 52, 54, 56, 58, 60, 62 and 64 corresponds to one of the aforementioned seven groups of microchannels that comprise cooler 10.

For example, sheet 76 includes apertures 80, shown more clearly in FIG. 7, and sheet 78 includes apertures 82, shown more clearly in FIG. 8. The rows 72 of apertures 80, each of which extends parallel to the X-axis, are arranged to align with the rows 74 of apertures 82, when sheets 76 and 78 are super-imposed. The rows 72 of apertures 80 extend coextensive with the rows 74 of apertures 82 and form a plurality of microchannels 18 when sheets 76 and 78 are super-imposed. Typically, apertures 80 and 82 are approximately the same width, which in this example measures 0.0076 cm along the Y-axis. The width of each aperture 80 extends coextensive with each aperture 82 when sheets 76 and 78 are super-imposed. Regions 84 between apertures 80, measured along the X-axis, are shorter than regions 86 between apertures 82, providing apertures 80 and 82 with differing lengths. This results in regions 84 overlapping apertures 82 and regions 86 overlapping apertures 80. Registration holes 88 of a generally circular shape are formed into opposite corners of each copper sheet 68, as are scribe traces 69 which surround each pattern of apertures associated with a cooler 10.

The aforementioned apertures are formed into each copper sheet 68 using a suitable chemical etchant, such as ferric chloride. After the etching step, each sheet 68 is then coated with a thin layer of silver. This silver coating is too thin to be accurately depicted in the drawing. Although any conventional coating method may be used, electroless plating of the sheets 68 in a bath such as silver cyanide is used in this embodiment, as it is economical.

Pins 90 are then inserted through a set of registration holes 88 in order to precisely align silver coated copper sheets 68. Typically, each cooler 10 is formed from three sheets 76, with a sheet 78 disposed between any two adjacent sheets 76. Seven groups 52, 54, 56, 58, 60, 62 and 64 of microchannels 18 are formed from the resulting combined thickness of super-imposed sheets 76 and 78. Substrate 14 is formed from a silver-plated copper sheet 66, having only registration holes 88 and scribe traces 69 formed therein, which is disposed proximate to a sheet 76, opposite to a sheet 78. Baffles 38 are formed from regions 84 and 86 between apertures 80 and 82, respectively. Specifically, baffle sets 38a, 38c and 38e correspond to regions 86 and baffle sets 38c and 38d correspond to regions 84.

The position of each baffle 38 along the Z axis of cooler 10, is a function of the position of sheets 76 and 78 among the stack of sheets 68. For example, one baffle 38 associated with each of sets 38a, 36c and 36d is disposed spaced apart from substrate 14. This results from sheet 78 being disposed between two adjacent sheets 76. Conversely, one baffle 38 associated with sets 36b and 36d is disposed adjacent to substrate 14.

Varying the positions of each baffle 38 along the X-axis is achieved by arranging regions 84 to overlap at different points along the length of apertures 82, measured parallel to the X-axis, upon sheets 76 and 78 being super-imposed. Similarly, regions 86 may be arranged to overlap apertures 80 at different points along the aperture's length. The position of region 84 and 86 along the X-axis may be varied while maintaining a constant length for the same. This may be achieved by varying the relative length of adjacent apertures 80 and 82 in a given row 72 and 74 so that the combined length of all the apertures 80 and 82 in the row 72 and 74 is constant. Alternatively, the length of the regions 84 and 86 may be varied by increasing and/or decreasing the length of the apertures 80 and 82 in a given row 72 and 74, which would inherently vary the position of the regions 84 and 86 along the X-axis. In the present example, however, apertures 80 and 82 located proximate to the opposed ends of each row 72 and 74 are longer than apertures 80 and 82 disposed therebetween. This facilitates thermal equilibrium between the points on the surface of substrate 14.

To provide a flow of coolant to each group of microchannels formed from groups 52, 54, 56, 58, 60, 62 and 64 of apertures 80 and 82, a fluid distribution sheet 94 may be positioned at one end of the stack of sheets 68 proximate to sheet 76 and opposite to sheet 66, shown more clearly in FIG. 9. Fluid distribution sheet 94 includes a plurality of columns 98 of inlet 100 holes. Disposed between any two adjacent columns 98 of inlet holes 100 is a column 102 of outlet holes 104. Each group of microchannels formed from aperture groups 52, 54, 56, 58, 60, 62 and 64 is associated with a column 98 of inlet holes 100 and a column 102 of outlet holes 104. Interleaving the inlet and outlet holes 100 and 104 allows each microchannel 18, associated with one of the aforementioned groups, to be of minimal length. This facilitates thermal equilibrium among various points of the surface of substrate 14, by allowing coolant to exit the microchannel before providing too great of a thermal gradient in the coolant flow traveling between an inlet hole 100 and an outlet hole 104 associated with the microchannel. Finally, fluid distribution manifold 24 is attached to fluid distribution sheet 94. Fluid distribution manifold 24 is formed from copper and also includes registration holes 88.

Referring to FIGS. 2, 8, 10 and 11, fluid distribution manifold 24 includes an interleaved plate 106, a first side of which has a plurality of parallel and spaced-apart recessed portions 108 separated by a rib 107. Each recessed portion 108 is arranged to align with one of columns 98 or 102 when super-imposed with fluid distribution sheet 94. A through-hole 110 is disposed at one end of each of the recessed portion 108, with any adjacent pair of through-holes 110 being disposed at opposite ends of the adjacent recessed portions 108.

On a side opposite to recessed portions 108, interleaved plate 106 includes two parallel spaced apart grooves 109 and 111, with each recessed portion being uniquely associated with one of the spaced apart grooves 109 and 111 via one of the through-holes 110.

Coupled to interleaved plate 106, on a side opposite to fluid distribution sheet 94, is a conduit coupling plate 112. One side of conduit plate 112 includes an input orifice 114 and an output orifice 116. Input orifice 114 is adapted to be in fluid communication with input conduit 32, and output orifice 116 is adapted to be in fluid communication with output conduit 34. A feed groove 118 and a drain groove 120 is integrally formed with conduit coupling plate 112 and disposed on a side thereof opposite to the side in which orifices 114 and 116 are formed. Feed groove 118 provides fluid communication between input orifice 114 and each of through-holes 110 in fluid communication with groove 111. Similarly, drain groove 120 provides fluid communication between output orifice 116 and each of through-holes 110 in fluid communication with groove 109. In this fashion, fluid distribution manifold 24 allows simultaneous ingress of coolant 28 into each microchannel 18 formed from aperture groups 52, 54, 56, 58, 60, 62 and 64 through a single input conduit 32. Coolant 28 flowing through each microchannel 18 formed from groups 52, 54, 56, 58, 60, 62 and 64 may simultaneously egress from cooler 10 through a single output conduit 34.

To permanently couple sheets 76, 78, 94 to substrate 14 and fluid distribution manifold 24, the same is clamped together with a stainless steel clamps 122, having holes allowing for the protrusion of the alignment pins 90 and the inlet 32 and outlet 34 conduits. Alignment pins 90 are removed, and a sufficient amount of heat is applied to melt the combination of copper and silver, forming a fused or eutectic alloy and brazing the sheets 76, 78, 94, substrate 14 and manifold 24 together, while the copper defining the microchannels and the inlet and outlet apertures and conduits is not melted at this temperature. The clamp is then removed after the stack has cooled and then braze hardened.

As shown in FIG. 12, micro-cooler 10 is formed from sub-portions of stacked sheets 76, 78 and 94 with substrate 14 positioned on one side of micro-cooler 10 and fluid distribution manifold 24 positioned on an opposite side. Shown is one whole microchannel 18 and partial views of two adjoining microchannels 118 and 218, each of which is disposed on opposite sides of microchannel 18. Microchannel 18 may be associated with group 54 of apertures 80 and 82, shown more clearly in FIGS. 8 and 9. Microchannel 118 may be associated with group 52 of apertures 80 and 82, and microchannel 218 may be associated with group 56 of apertures 80 and 82. In this fashion, stream 124 of coolant 28, entering micro-cooler 10, flows from input conduit 32 and passes through input orifice 114. Upon exiting input orifice 114, stream 124 passes through feed groove 118, in coupling plate 112, and then into groove 109 of interleave plate 106. Stream 124 exiting groove 109 enters into microchannels 18 and 118 by passing through through-hole 110 of interleave plate 106 and then through inlet hole 100.

As shown, inlet hole 100 is in fluid communication with both microchannels 18 and 118. As a result, as shown in FIG. 12, stream 124 bifurcates after exiting inlet hole 100, forming two branches 126 and 128. Branch 126 enters microchannel 118 and branch 128 enters microchannel 18. Upon encountering baffles 38 of microchannel 118, branch 126 forms a plurality of tributaries 130 in the manner discussed above with respect to FIG. 2. Similarly, branch 128 forms a plurality of tributaries 132 upon encountering baffles 38 associated with microchannel 18. As tributaries 132 exit microchannel 18, they merge with tributaries 134 exiting microchannel 218, forming stream 136. Stream 136 exits through outlet hole 104 and enters recessed portion 108, traveling through an output conduit (not shown) by traveling through another portion of manifold 24.

Referring to FIGS. 2, 13 and 14, an additional benefit of baffles 38 is shown as facilitating control of effective fin width. As discussed above, microchannels 18 are defined between two spaced apart fins 12. Each fin 12 is formed by stacking a plurality of sheets, each of which includes spaced apart apertures. In the prior art, shown in FIG. 13, engineering tolerances preclude precise alignment of the spaced apertures 300 in adjacent sheets 302, resulting in misalignment of fin portions 304 which form fins 312. This results in a reduction in the effective width "$\delta_1$" of fins 312. For purposes of this application, effective width "$\delta_1$" is defined as the regions of which are axially aligned along a direction parallel to a normal $\vec{N}$ to substrate 314. Reducing the effective width "$\delta_1$" of fins 312 has the deleterious effect of increasing thermal impedance of the same. The problem of controlling the effective width "$\delta_1$" of fins 312 is exacerbated as the width of fin portions 304 decreases.

Referring to FIGS. 2 and 14, baffles 38 facilitate control of the effective width "$\delta_2$" of fins 12 by reducing the number of fin portions 204 that must be aligned. As shown, for baffle sets 38a, 38c and 38e, there are only three fin portions 204 that effect the effective fin width "$\delta_2$". This results from baffles 38 being formed from a solid layer 206, in this case silver-plated copper, which is disposed between fin portions 204. This reduces the number of fin portions 204, the engineering tolerances of which, in the aggregate, compromise the effective width "$\delta_2$" of fins 12.

We claim:

1. A cooler for removing heat from a heated region, comprising:

a thermally conductive substrate in heat exchange communication with said heated region;

a body disposed in heat exchange communication with said substrate;

a supply of coolant, with said body including a plurality of said paths adapted to receive said coolant, with coolant flowing through each of said plurality of paths defining a coolant flow; and a plurality of baffles disposed in at least some of said paths, transverse to a direction of said coolant flow, with said baffles associated with any such path having differing lengths, measured parallel to said direction, to minimize back pressure and disrupt laminar flow along such paths through modulation of said coolant flow relative to its flow velocity or direction of flow or both.

2. The cooler as recited in claim 1 wherein said battles extending across said paths dividing said coolant flow associated therewith into a plurality of tributaries.

3. The cooler as recited in claim 1 wherein said thermally conductive substrate lies within a plane and said baffles vary in position and length in the direction of said coolant flow, associated with said paths, and in a direction transverse to said plane.

4. The cooler as recited in claim 1 wherein said substrate lies along a plane and said body comprises of a plurality of sheets, each of which includes a plurality of apertures, said plurality of sheets arranged, in a direction normal to said plane, as a contiguous stack.

5. The cooler as recited in claim 1 further including a manifold disposed between said supply of coolant and in fluid communication with each of said plurality of paths, with coolant entering said manifold being divided into a plurality of flows, each of which is associated with one of said plurality of paths.

6. The cooler as recited in claim 1 wherein said body comprises of a plurality of sheets, one of which includes a plurality of spaced apart apertures, said plurality of sheets arranged as a contiguous stack with regions between said plurality of apertures defining said modulating means.

7. A cooler for removing heat from a heated region, comprising:

a thermally conductive substrate in heat exchange communication with said heated region;

a body disposed in heat exchange communication with said substrate;

a supply of coolant, with said body including a plurality of said paths adapted to receive said coolant, with coolant flowing through each of said plurality of paths defining a coolant flow;

means disposed in at least some of said paths for modulating one of said coolant flows so that laminar flow present in said paths is disrupted;

said modulating means includes a plurality of baffles disposed in said at least some of said paths, transverse to a direction of said coolant flow, with said baffles associated with any such given path having differing lengths, measured parallel to said direction, to minimize back pressure.

8. A cooler for removing heat from a heated region, comprising:

a thermally conductive substrate in heat exchange communication with said heated region;

a body disposed in heat exchange communication with said substrate;

a supply of coolant, with said body including a plurality of said paths adapted to receive said coolant, with coolant flowing through each of said plurality of paths defining a coolant flow;

means disposed in said paths for modulating said coolant flows wherein laminar flow present in said paths is disrupted;

said modulating means includes a plurality of baffles associated with each of said plurality of paths, said baffles extending transverse to said paths and having a length measured parallel to said a coolant flow, with a length of at least some of said baffles being different along a length of said paths.

9. A cooler removing heat from a heated region, comprising:

a thermally conductive substrate in heat exchange communication with said heated region;

a body disposed in heat exchange communication with said substrate and including a plurality of spaced apart heat conductive fins, with each pair of adjacent fins defining a microchannel therebetween, forming a plurality of parallel microchannels;

a supply of coolant, with each of said microchannels adapted to receive said coolant, defining a coolant flow within each of said microchannels;

baffles disposed in at least some of said channels to modulate coolant flow within the microchannels by changing either coolant velocity or direction of coolant flow or both in said at least some of said microchannels; and means in said baffles to minimize back pressure of coolant flow while amplifying thermal conductivity in said microchannels in a direction transverse to said coolant flow.

10. The cooler as recited in claim 9 wherein said coolant flow present within each of said microchannels defines a thermal impedance between said substrate and a sub-portion of said fins, and wherein said amplified thermal conductivity comprises a baffle disposed within each of said microchannels to vary said thermal impedance.

11. The cooler as recited in claim 10 wherein each of said microchannels defines a width, transverse to said coolant flow with said baffle extending across said width to divide said coolant into a plurality of tributaries.

12. The cooler as recited in claim 9 wherein said thermally conductive substrate lies within a plane and said baffles adapted to vary a direction of said coolant flow in a direction perpendicular to said plane.

13. The cooler as recited in claim 9 wherein said substrate lies along a plane and said body comprises of a plurality of sheets, each of which includes a plurality of spaced-apart apertures, with said sheets arranged along a direction normal to said plane, as a contiguous stack, super imposing apertures of adjacent sheets.

14. The cooler as recited in claim 13 wherein each of said plurality of microchannels includes said baffles with regions between said apertures providing said amplified thermal conductivity.

15. The cooler of claim 9 wherein said back pressure minimizing means comprises reduction of baffle length of said baffles in the direction coolant flow.

16. The cooler of claim 9 wherein said back pressure minimizing means comprises:

a plurality of spatially disposed sets of baffles along said at least some of said channels extending transversely of the direction of coolant flow;

the length of baffles in adjacent baffle sets in the direction coolant flow having different lengths.

17. The cooler of claim 16 wherein said baffle sets at opposite ends of the coolant flow have a longer length in the direction of coolant flow and are alternated therebetween in the direction of coolant flow with at least one baffle set having shorter lengths in the direction of coolant flow.

18. A cooler removing heat from a heated region, comprising:

a thermally conductive substrate in heat exchange communication with said heated region;

a body disposed in heat exchange communication with said substrate and including a plurality of microchannels;

a supply of coolant, with each of said microchannels adapted to receive said coolant, defining a coolant flow, said coolant flow having a pressure associated therewith;

a plurality of baffles disposed in said paths, transverse to a direction of said coolant flow, with said baffles associated with any such path having differing lengths, measured parallel to said direction, to minimize back pressure and disrupt laminar flow along such paths through modulation of said coolant flow relative to its flow velocity or direction of flow or both;

said baffles forming a plurality of serpentine flow paths within said microchannels dividing said coolant flow into a plurality of tributaries in the direction of coolant flow.

19. The cooler as recited in claim 18 wherein said microchannels are formed by a plurality of spatially disposed thermally conductive fins with each pair of adjacent fins defining a microchannel, a coolant flow present within each of said microchannels defining a thermal impedance between said substrate and a sub-portion of said fins, with sets of said baffles disposed within said microchannels to minimize thermal impedance alone said microchannels.

20. A cooler removing heat from a heated region, comprising:

a thermally conductive substrate in heat exchange communication with said heated region;

a body disposed in heat exchange communication with said substrate and including a plurality of microchannels;

a supply of coolant, with each of said microchannels adapted to receive said coolant, defining a coolant flow, said coolant flow having a pressure associated therewith;

means for forming a serpentine flow path within said microchannels by dividing said coolant flow into a plurality of tributaries;

said microchannels are formed by a plurality of spatially disposed thermally conductive fins with each pair of adjacent fins defining a microchannel, a coolant flow present within each of said microchannels defining a thermal impedance between said substrate and a sub-portion of said fins, with said forming means including a plurality of baffles disposed within each of said microchannels to vary said thermal impedance; and each of said microchannels defines a width, transverse to said coolant flow and each of said baffles extend across said width to divide said coolant into said plurality of tributaries, each of said baffles having a length, measured parallel to said coolant flow, with the length of said baffles varying along a length of said microchannel.

21. The cooler as recited in claim 20 wherein said baffles have a height associated therewith, measured transverse to both said width and said length, with said height being equal to said width, but substantially less than a height of said microchannels.

22. The cooler as recited in claim 21 wherein said height and width measures 0.0127 cm.

* * * * *